(12) United States Patent
McTeer et al.

(10) Patent No.: US 6,194,308 B1
(45) Date of Patent: Feb. 27, 2001

(54) METHOD OF FORMING WIRE LINE

(75) Inventors: Everett A. McTeer; Russell C. Zahorik; Scott G. Meikle, all of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/421,165

(22) Filed: Oct. 19, 1999

Related U.S. Application Data

(62) Division of application No. 08/588,738, filed on Jan. 19, 1996, now Pat. No. 6,040,613.

(51) Int. Cl.$^7$ .................................................. H01L 31/0232
(52) U.S. Cl. ........................ 438/627; 438/584; 438/622; 438/636; 257/437; 257/764; 257/765
(58) Field of Search ........................ 438/636, 584, 438/622, 627; 257/437, 764, 765

(56) References Cited

U.S. PATENT DOCUMENTS

| | | |
|---|---|---|
| 4,676,866 | 6/1987 | Tang et al. . |
| 4,816,424 | 3/1989 | Watanabe et al. . |
| 4,877,505 | 10/1989 | Bergmann . |
| 4,920,071 | 4/1990 | Thomas . |
| 5,154,949 | 10/1992 | Shindo et al. . |
| 5,162,262 | 11/1992 | Ajika et al. . |
| 5,231,306 | * 7/1993 | Meikle et al. ........................ 257/751 |
| 5,290,588 | 3/1994 | Romero et al. . |
| 5,429,975 | 7/1995 | Sheu et al. . |
| 5,523,609 | 6/1996 | Fukusho . |
| 5,589,712 | 12/1996 | Kawashima et al. . |

\* cited by examiner

*Primary Examiner*—Charles Bowers
*Assistant Examiner*—Lisa Kilday
(74) *Attorney, Agent, or Firm*—Trask Britt

(57) ABSTRACT

Titanium aluminum nitrogen ("Ti—Al—N") is deposited onto a semiconductor substrate area to serve as an antireflective coating. For wiring line fabrication processes, the Ti—Al—N layer serves as a cap layer which prevents unwanted reflection of photolithography light (i.e., photons) during fabrication. For field emission display devices (FEDs), the Ti—Al—N layer prevents light originating at the display screen anode from penetrating transistor junctions that would hinder device operation. For the wiring line embodiment, an aluminum conductive layer and a titanium-aluminum underlayer are formed beneath the antireflective cap layer. The Ti—Al underlayer reduces the shrinkage which occurs in the aluminum conductive layer during heat treatment.

20 Claims, 7 Drawing Sheets

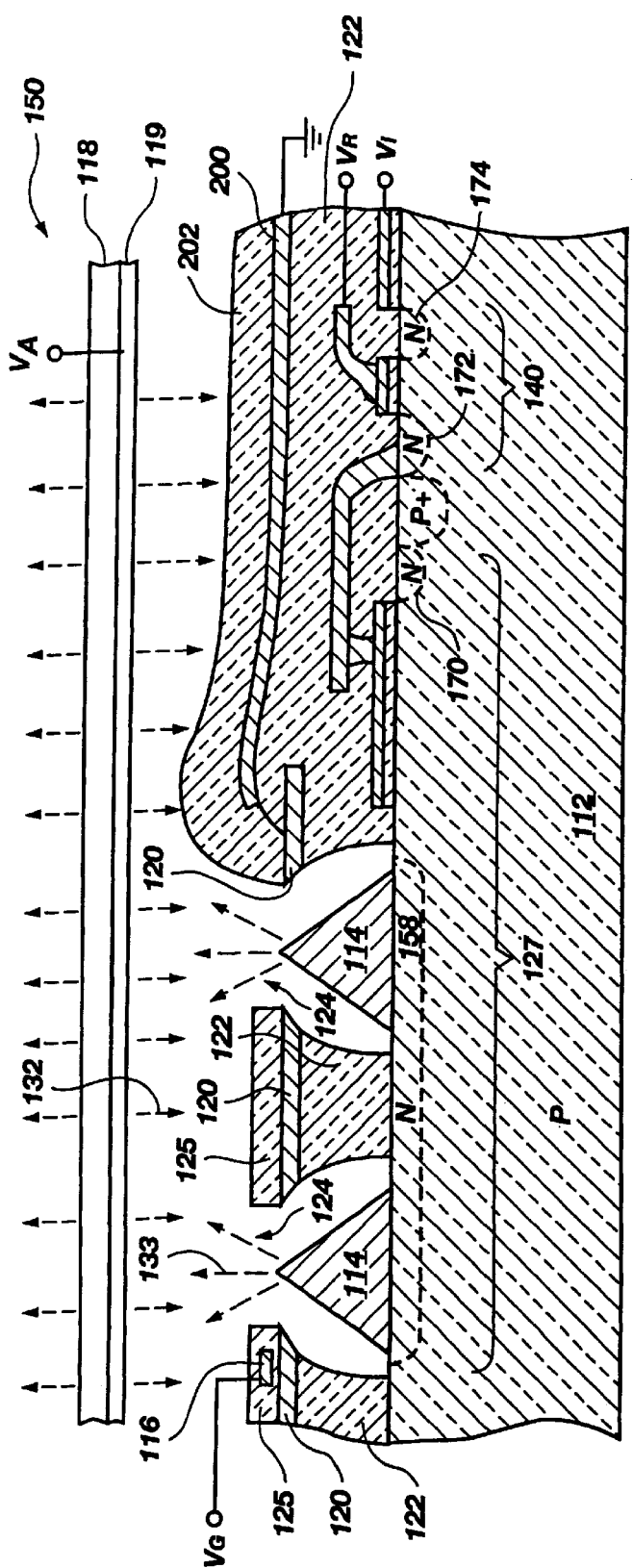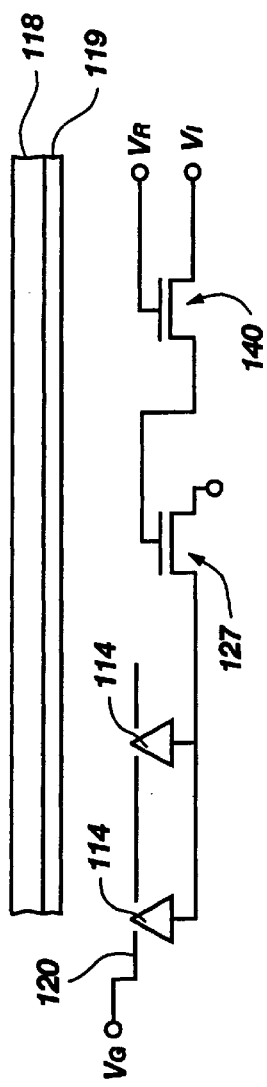
Fig. 9
Fig. 10

METHOD OF FORMING WIRE LINE

CROSS REFERENCE TO RELATED APPLICATION

This application is a divisional of application Ser. No. 08/588,738, filed Jan. 19, 1996 now U.S. Pat. No. 6,040,613.

BACKGROUND OF THE INVENTION

This invention relates to semiconductor fabrication processes and, more particularly, to antireflective coatings and wiring line processes.

Integrated circuits (ICs) commonly are fabricated on a semiconductor wafer. The wafer typically is cut to form multiple semiconductor substrates or "IC chips". Semiconductor devices are formed on the wafer. Although the label semiconductor is used, the devices are fabricated from various materials, including electrical conductors (e.g., aluminum, tungsten), electrical semiconductors (e.g., silicon) and electrical non-conductors (e.g., silicon dioxide). The semiconductive silicon wafer is subjected to deposition, etching, planarizing and lithographic processes to achieve the many semiconductor devices. Aluminum and aluminum alloy metallization techniques are used to create contacts and interconnects among devices.

The advantages of manufacturing ICs with smaller individual circuit elements so that device density is increased are well known: electronic equipment becomes less bulky, reliability is improved by reducing the number of connections, assembly and packaging costs are minimized, and circuit speeds increase. Interconnect technology is increasingly a limitation in increasing circuit density or very large scale integration (VLSI) devices. In particular, achieving smaller line widths and smaller line spacings typically controls the number of devices that can occur on a semiconductor substrate. The ability to minimize the line widths and line spacings is limited by the lithographic processes, among others.

The term "lithographic process" refers to a process in which a pattern is delineated in a layer of material sensitive to photons, electrons or ions. The principle is similar to that of a photo-camera in which an object is imaged on a photo-sensitive emulsion film. While with a photo-camera the "final product" is the printed image, the image in the semiconductor process context typically is an intermediate pattern which defines regions where material is deposited or removed. An antireflective material is desired during photolithographic processes to define areas to remain intact (e.g., positive exposure) or to be removed (e.g., negative exposure).

A current problem in patterning small dimensions for very large scale integrated ("VLSI") circuits is notching of line edges, or, more generally, non-uniform line formation. Notching refers to grooves or other uneven cuts (i.e., "notches") detracting from straight edges. Such notching has been less significant when patterning larger line widths and line spacing because the size of the notch relative to the line width or spacing was relatively small. At the smaller dimensions, however, notches can sever or significantly decrease a line width. A severed wiring line, for example, is an open circuit, and thus is defective. Reflection of light off metal lines during photolithography is one cause of notching.

FIGS. 1A and 1B show notched wiring lines 10, 13, and 15 formed on a semiconductor substrate 11, wherein said notched wiring lines 10, 13, and 15 are separated by an insulative material 17 disposed over the semiconductor substrate 11. The notched wiring line 10 has a portion 12 along its length which is substantially thinner than other portions 14, 16. This thinner portion 12 is more susceptible to electromigration and stress migration. Electromigration is the transport of metal atoms by momentum exchange between electrons and metal ions. As the electrons move under the influence of a field, collisions between the electrons and ions, transfer momentum to the ions. The ions, in turn, move in the direction of electron flow, leaving a vacancy in the wiring line metal. Over time, the vacancies accumulate, forming voids of non-conductivity in the metal. In effect, a defective open circuit occurs.

Stress migration is the atomic migration induced by thermal cycling of a wiring line between high operating temperatures and low environmental temperatures. The thermal cycling causes mechanical stresses on the thin lines, commonly referred to as creeping. The stress increases as the line width decreases. The predominant failure again is voiding in the metal, resulting in defective open circuits in wiring lines. Accordingly, uniform lines are desired to avoid notching and the resulting susceptibility to electromigration and stress migration. Such uniform lines are desired for increasingly smaller line widths and line spacings.

Another cause of migration failures in wiring lines is shrinkage during heat treatment processes. A conventional wiring line includes a conductor layer (e.g., aluminum) and an underlayer (e.g., titanium). During the fabrication processes which produce the wiring line and adjacent integrated circuitry, the titanium and aluminum undergoes a heat treatment process. During such process, adjacent regions of aluminum and titanium react to form a titanium aluminum compound between the titanium layer and the aluminum layer. In one application, the stable compound formed is $TiAl_3$. In forming the compound, however, the aluminum layer shrinks, resulting in a 4–8% volume loss at the aluminum layer. This volume loss has the undesired effect of increasing stress in the aluminum layer, (e.g., stress increases by 3–4 times for small line dimensions). As a result, voids are prone to form over time due to stress migration and electromigration. At small line dimensions, the metal may even go beyond its yield strength and break, leaving undesired voids after the heat treatment process. Accordingly, there is a need for a wiring line formation process which avoids undue stress upon the conductive layer.

There also is a need for an antireflective coating applied to a semiconductor substrate of a flat panel display device. In a cold cathode field emission display ("FED") device, the quality and sharpness of an illuminated pixel site of the display screen is dependent on the precise control of the electron emission from emitter sites that illuminate a particular pixel site. In forming a visual image, such as a number or letter, different groups of emitter sites must be cycled on or off to illuminate the appropriate pixel sites on the display screen. To form a desired image, electron emission may be initiated in the emitter sites for certain pixel sites while the adjacent pixel sites are held in an off condition. For a sharp image, it is important that those pixel sites that are required to be isolated remain in an off condition.

One factor that may cause an emitter site to emit electrons unexpectedly is the response of semiconductor junctions in the FED drive circuitry to photons. The adverse photons are generated by the luminescent display screen and/or by photons present in the environment (e.g., lights, sunshine). This may affect the junctions by changing their electrical characteristics. In some cases, this may cause an unwanted current to pass across the junction. The unwanted current may initiate electron emission from emitter sites of adjacent pixels. Such emission, in turn, may cause the adjacent pixel to illuminate when a dark pixel is desired. From a viewer's perspective, illumination of undesired pixels may cause degraded or blurry images. Besides isolation and activation problems, light from the environment and display screen striking junctions on the substrate may cause other problems in addressing and regulating current flow to the emitter sites of the FED cell. Accordingly, there is a need to prevent given junctions from undesired exposure to photons.

SUMMARY OF THE INVENTION

According to the invention, titanium, aluminum and nitrogen ("Ti—Al—N") are deposited onto a semiconductor substrate area to serve as an antireflective coating. For wiring line fabrication processes, the Ti—Al—N layer prevents unwanted reflection of photolithography light (i.e., photons) during fabrication. For field emission display devices (FEDs), The Ti—Al—N layer prevents light originating at the display screen anode from penetrating transistor junctions that would hinder device operation.

According to one aspect of the invention, a wiring line (e.g., conductive path, interconnect) is formed by a titanium aluminum nitrogen ("Ti—Al—N") cap layer, an aluminum conductive layer, and a titanium aluminum underlayer. The Ti—Al—N cap layer serves as the antireflective layer. The Ti—Al—N layer overlays the aluminum layer which overlays the titanium-aluminum underlayer.

According to another aspect of the invention, the titanium-aluminum underlayer is deposited onto the substrate (or onto a barrier layer of the substrate, or onto a contact or via metallization layer) via sputtering or another physical vapor deposition (PVD) process. Thereafter, the aluminum layer is deposited, followed by the Ti—Al—N layer. By applying a Ti—Al underlayer, as opposed to a titanium-only underlayer, there is less shrinkage of the aluminum layer. For example, whereas an approximately 4000 angstrom aluminum layer over 500 angstroms of titanium would shrink by approximately 120 angstroms in certain heat treatment steps, starting with a Ti—Al underlayer minimizes the shrinkage and volume loss of the aluminum layer. As a result, less stress is introduced to the aluminum layer during fabrication processes. The aluminum layer then is less susceptible to electromigration and less susceptible to stress migration.

According to one advantage of the invention, the Ti—Al—N cap layer reduces reflectance by a factor of approximately 10 relative to a conventional titanium nitride cap layer for a typical photolithographic wavelength (e.g., 365 nanometers). As a result, notching is substantially reduced and electromigration resistance and stress migration resistance are improved. According to another advantage, the use of titanium-aluminum as an underlayer reduces stress at the aluminum layer, thereby improving electromigration resistance and stress migration resistance. Also, the use of a titanium-aluminum underlayer avoids the need for a separate sputter chamber when forming the Ti—Al—N cap layer.

According to another aspect of the invention, an antireflective Ti—Al—N layer is applied to a field emission display ('FED') device to protect drive circuitry junctions from photons generated in the environment or by the display screen anode. When fabricating the drive circuitry on a semiconductor substrate of an FED baseplate, an insulating layer typically is applied over the wiring lines and around the contacts. The antireflective Ti—Al—N layer is applied over such insulating layer. A passivation layer or insulation layer then is applied over the Ti—Al—N coating. Such a coating blocks photons from reaching the drive transistor junctions. An advantage of the antireflective coating is to protect the junctions from adverse changes to their electrical characteristics.

These and other aspects and advantages of the invention will be better understood by reference to the following detailed description taken in conjunction with the accompanying drawings.

BRIEF DESCRIPTION OF THE SEVERAL VIEWS OF THE DRAWINGS

FIG. 9 is a diagram of part of a field emission display device having an antireflective Ti—Al—N layer according to an embodiment of this invention; and FIG. 10 is an electrical schematic of the FED portion of FIG. 9.

DETAILED DESCRIPTION OF THE INVENTION

Overview

Figure 2:
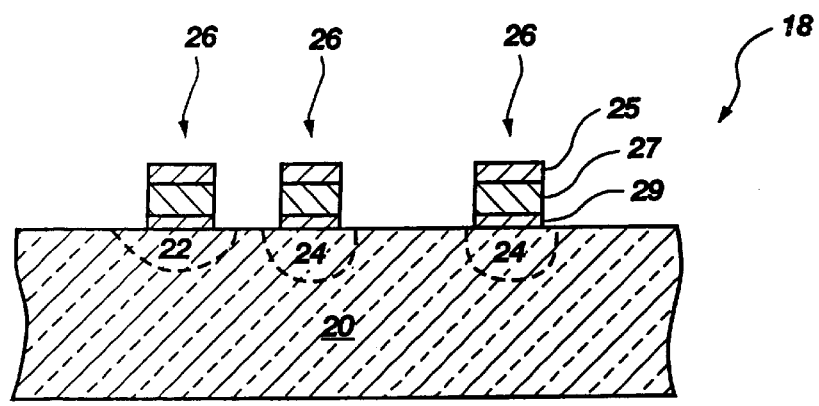
FIG. 2 is a partial cross-sectional view of a partially-formed conventional integrated circuit.

FIG. 2 shows a partial cross-sectional view of an integrated circuit (IC) 18 formed on a semiconductor substrate 20. The semiconductor substrate 20 includes various n-type and p-type doped regions 22, 24 interconnected by wiring lines 26. The interconnected substrate regions define desired semiconductor devices. The wiring lines are formed with or without a cap layer 25 overlaying a conductive layer 27 overlaying an underlayer layer 29. A conventional cap layer 25 is formed by titanium nitride. A conventional conductive layer 27 is formed by aluminum. A conventional underlayer 29 is formed by titanium.

Figure 1A:
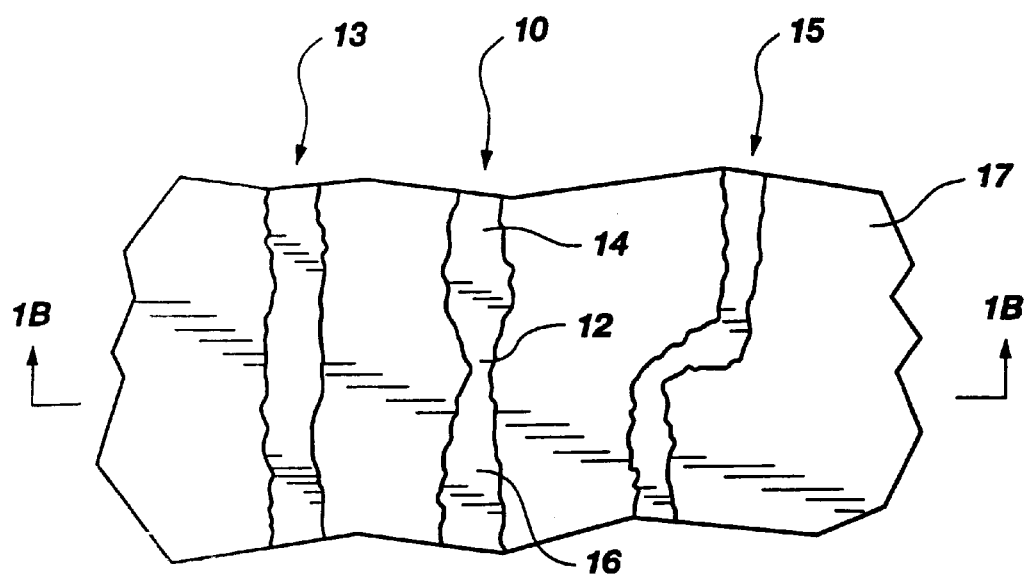
FIGS. 1A and 1B are a top plan view and a cross-sectional view along line 1B—1B of FIG. 1A, respectively, of conventional wiring lines on a semiconductor substrate exhibiting notching.
Figure 1B:
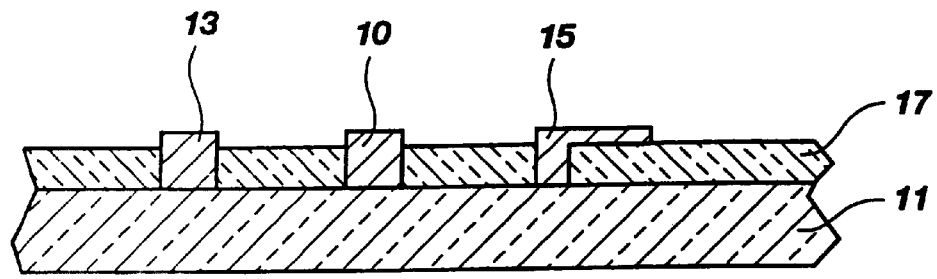
Figure 3:
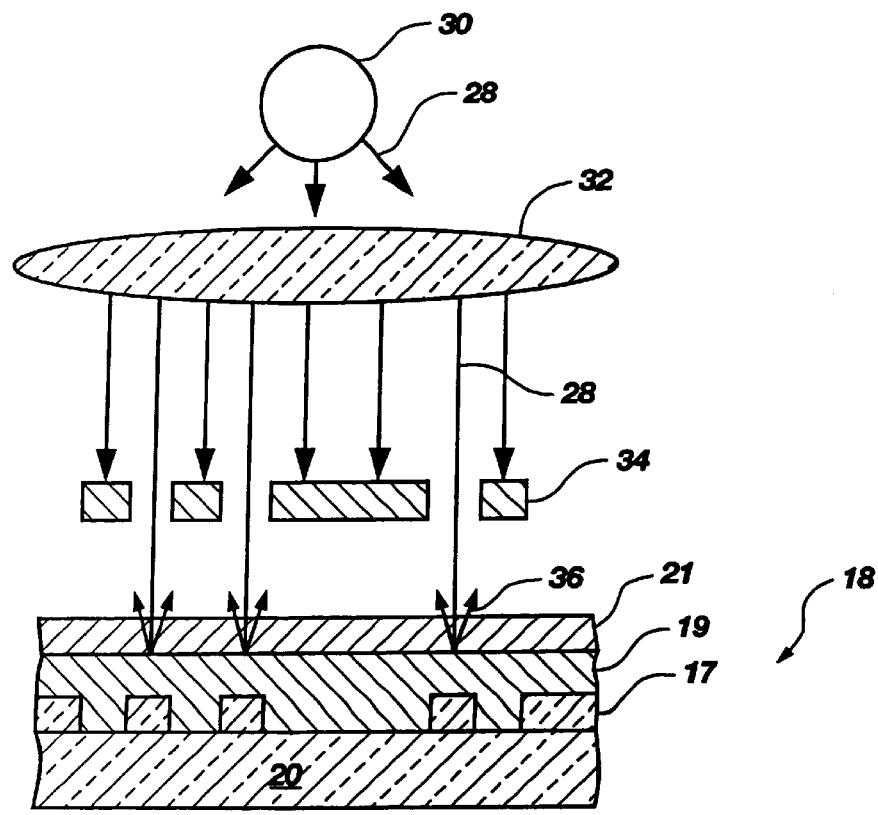
FIG. 3 is a simplified block diagram showing the conventional IC of FIG. 2 undergoing a photolithographic process.

Two problems occurring in the prior art are addressed by this invention. First, reflectivity of the surface of the conductive layer scatters photolithographic light during photo exposure. For patterning of small dimensions, the scattering is more significant. FIG. 3 shows a conventional integrated circuit undergoing a photolithographic process in which light 28 from a source 30 is directed via a lens 32 through a mask 34 onto the IC 18 (i.e., into photoresist layer 21). The light defines the dimensions of the wiring lines 26 (see FIG. 2) and the inter-line spacing. Metal conductive line layer 19 exhibiting reflection scatters the light 28, resulting in scattered light 36. The scattered light 36 causes development of undesired areas of photoresist layer 21. The undesired result is notching of lines (see FIG. 1A). Accompanying the notching is increased susceptibility to electromigration and stress migration failures. The solution to this first problem is to decrease the reflectivity of the cap layer. This is achieved by applying Ti—Al—N as the cap layer.

The second problem addressed is reaction of the aluminum conductive layer and titanium underlayer during heat treatment processes of the IC 18. It has been found that when patterning line dimensions less than 1 micron for a Ti—N/Al/Ti metal stack, shrinkage of the middle aluminum layer during heat treatment caused voids and susceptibility to electromigration and stress migration failures. For example, during a heat treatment process at 425 degrees Centigrade for approximately 100 minutes, an aluminum layer exhibits a 4–8% volume loss. The loss is due to aluminum reacting with a titanium underlayer to form a stable compound (TiAl$_3$). Although a 425 degree C. temperature process is presented, reaction occurs for other heat treatment processes using lower or higher temperatures. The accompanying result is an increase in stress by a factor of 2 to 4 times. Accordingly, stress migration resistance and electromigration resistance of the aluminum layer is substantially compromised. Even more significantly, in some instances, the stress goes beyond the metal yield strength, causing fractures in the aluminum during processing. The solution to this second problem is to apply a Ti—Al underlayer, in effect buffering the aluminum layer so that less aluminum reacts with an underlayer or a barrier layer during the heat treatment processes of the IC.

Wiring Line Structure

Figure 4A:
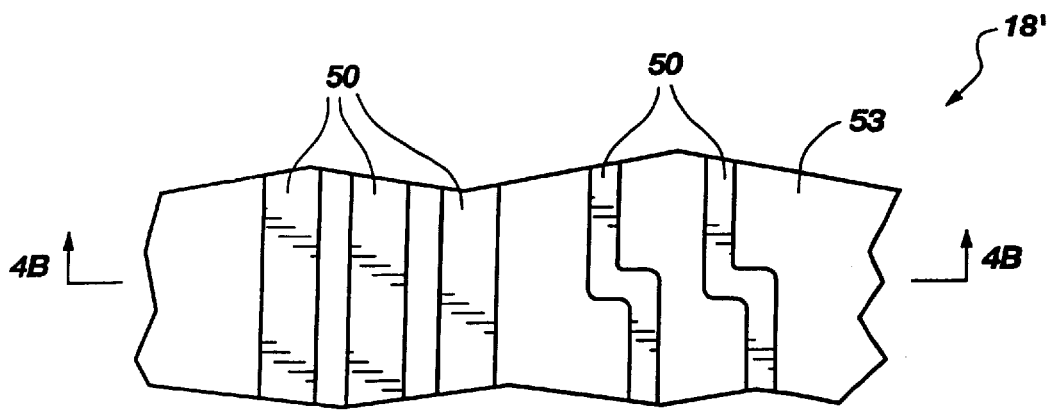
FIGS. 4A and 4B are a top plan view and a cross-sectional view along line 4B—4B of FIG. 4A, respectively, of the integrated circuit of FIG. 3 having wiring lines formed according to an embodiment of this invention.
Figure 4B:
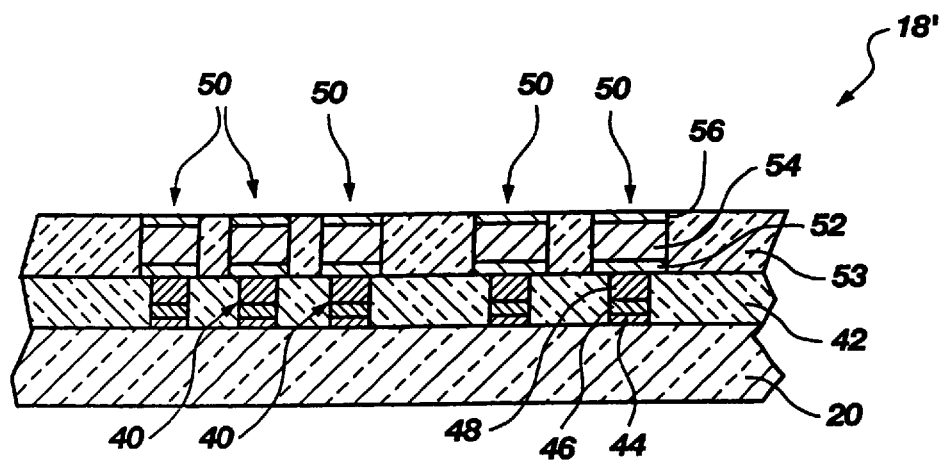

FIGS. 4A and 4B show an integrated circuit 18' being processed according to an embodiment of this invention. The IC 18 is formed on a semiconductor substrate 20. Contacts 40 are formed in an oxide layer 42 adjacent to the semiconductor substrate 20. An exemplary contact structure 40 includes a layer 44 of titanium, a layer 46 of titanium-nitride, and a layer 48 of tungsten. Wiring lines 50 are formed as metal stacks above the contacts 40. Wiring lines 50 include a conductive layer 54, an underlayer layer 52 and a cap layer 56. The cap layer 56 overlays the conductive layer 54, which in turn overlays the underlayer 52.

The conductive layer 54 serves as the primary conductive path defined by each wiring line 50 and typically is thicker than the adjacent wiring line layers 52, 56. The conductive layer 54 typically is formed as a layer of aluminum, although gold or copper also is used in some embodiments. A typical thickness for the conductive layer 54 is approximately 2000–15000 angstroms. An insulative material 53 is disposed over the oxide layer 42 between the wiring lines 50.

Conventionally, an underlayer serves as a barrier preventing silicon at the semiconductor substrate 20 from diffusing into the conductive layer and reacting with the conductor. Alternatively, a separate barrier layer is included. The separate barrier layer is formed in various embodiments from (i) titanium, (ii) titanium-nitride, or (iii) a titanium-aluminum-nitrogen material. In the embodiment shown, a contact 40 separates the wiring line 50 from the semiconductor substrate 20. For such embodiment, the contact 40 includes the barrier layer exemplified by the titanium layer 44.

According to an aspect of this invention, the underlayer 52 serves as a buffer region for minimizing shrinkage of the conductive layer 54 during heat treatment. In the preferred embodiment, the underlayer 52 is formed of titanium-aluminum. A typical thickness is 50 to 1000 angstroms. A typical bulk resistivity is 100 to 500 micro-ohm-cm as deposited, and 20–100 micro-ohm-cm after being annealed.

According to an aspect of this invention, the cap layer 56 serves as an antireflective coating. In the preferred embodiment, the cap layer is formed from titanium, aluminum and nitrogen. Preferably, the compound includes 10% to 90% aluminum. Preferably, the cap layer 56 is between 50 and 1500 angstroms thick for a 2000–15000 angstrom conductive layer of aluminum.

Wiring Line Formation and Stress Reduction

Figure 5:
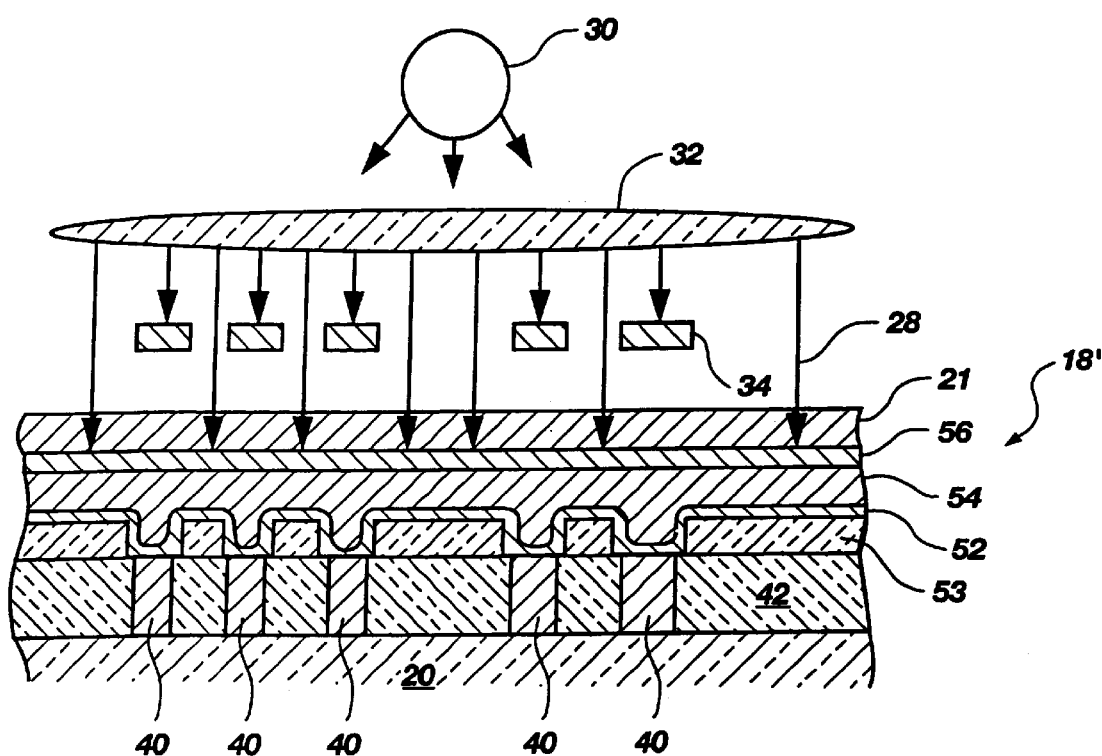
FIG. 5 is a diagram of a partially-formed integrated circuit according to an embodiment of this invention undergoing a photolithographic process.

The wiring line layers 52, 54, 56 are deposited onto the semiconductor substrate 20. The underlayer 52 typically is deposited by a sputtering process, although alternative physical vapor deposition processes or other deposition processes are used in other embodiments. In the preferred embodiment, a titanium-aluminum film is sputtered from a composite titanium/aluminum target onto the semiconductor substrate 20. Alternatively, titanium and aluminum are sputtered from separate targets. The conductive aluminum layer 54 then is deposited by a sputtering or other deposition process. Next, the Ti—Al—N cap layer 56 is deposited. In a preferred embodiment, titanium and aluminum are sputtered in an atmosphere of nitrogen to form a layer of titanium-aluminum-nitrogen. Because both the underlayer 52 and cap layer 56 deposition steps use a titanium-aluminum target, or separate titanium and aluminum targets, for sputtering, the same sputtering chamber can be used for each step. FIG. 5 shows the wiring line layers 52, 54, 56 before etching. FIG. 4A shows the etched wiring lines 50.

During semiconductor fabrication, the wiring lines 50 are exposed to heat treatment processes. During such processes, titanium and aluminum react to achieve a stable compound. Because the underlayer 52 already includes aluminum, less aluminum from the conductive layer 54 reacts with the titanium in the underlayer 52 at such time. Although some aluminum from the conductive layer 54 is likely to react with the titanium in the underlayer 52, the amount is substantially less than for the conventional stack described above with regard to FIG. 2. For a heat treatment at approximately 425 degrees centigrade for approximately 100 minutes, shrinkage is less than 60 angstroms (e.g., only about 53 angstroms) for an aluminum conductive layer 54 greater than 2000 angstroms thick on an underlayer approximately 500 angstroms thick. The specific shrinkage may vary depending on target concentrations, sputter tools, sputtering conditions, et cetera. This is a significant improvement over the approximately 120 angstroms of shrinkage for the conventional stack having the same layer dimensions. Also, the shrinkage is within tolerances of the aluminum's yield strength, thereby avoiding fractures. In addition, the electromigration resistance and the stress migration resistance is improved. The degree of shrinkage is also dependent on the stoichiometry of the titanium and aluminum. In the exemplary embodiment above, the underlayer applied to the substrate included approximately $\frac{2}{3}$ aluminum to $\frac{1}{3}$ titanium. An increased percentage of aluminum in the underlayer decreases the shrinkage in the conductive layer. Note that this inventive aspect of reducing conductive layer shrinkage applies for wiring lines without a cap layer or having a cap layer, as described above, or as having a conventional or other cap layer. For example, a Ti—Al/Al/Ti—Al or a Ti—Al/Al/Ti—Al$_x$ stack embodies the inventive aspect of reduced Al shrinkage in the middle conductive layer. Other exemplary cap layers included for embodiments implementing this underlayer aspect of the invention include Ti—N and Ti—Al$_x$—N.

Cap Layer Antireflectance Characteristics

Figure 6:
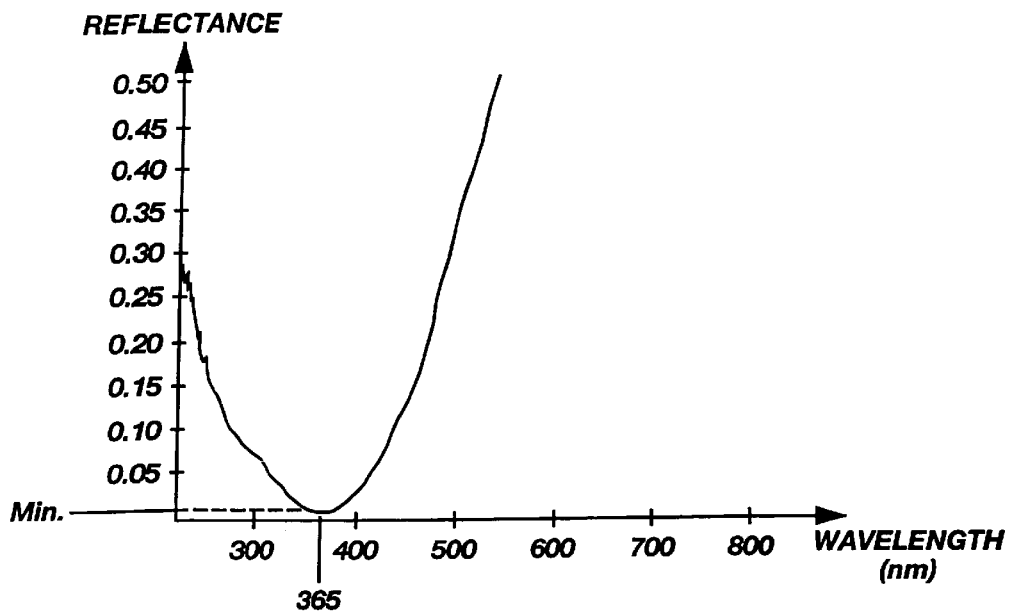
FIG. 6 is a chart of reflectivity versus light wavelength for a wiring line of FIG. 4.

During photolithography, the cap layer 56 is exposed to photons of light 28 from a light source 30. Referring to FIG. 5, the light 28 travels through a mask 34 striking the cap layer 56. The cap layer 56 serving as an antireflective coating absorbs the photons, reducing or avoiding light scattering. FIG. 6 is a chart of the reflectivity of the cap layer 56 of this invention at varying light wavelengths. The reflectivity is minimized as approximately 0.1 times the reflectance of a bare silicon wafer for light at approximately 365 angstroms. Such a wavelength is a typical wavelength for an "I-line" photolithographic process. Thus, the cap layer 56 serves effectively for patterning lines.

Figure 7:
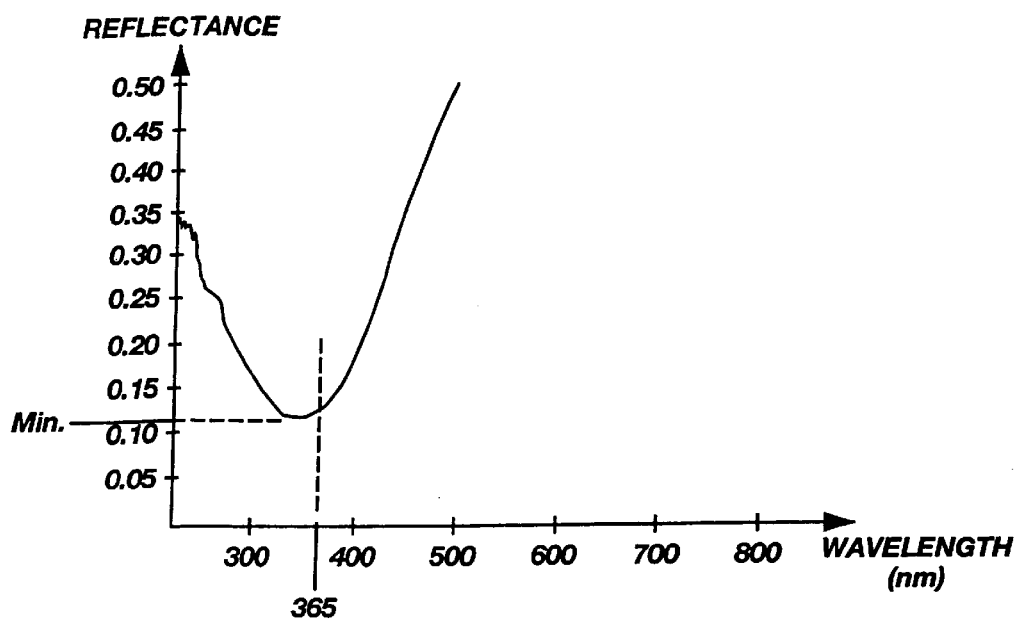
FIG. 7 is a chart of reflectivity versus light wavelength for a conventional wiring line.

FIG. 7 shows the reflectivity of a conventional cap layer formed of titanium nitride. The minimum reflectivity is approximately 0.12 times reflectance of a bare silicon wafer for light at approximately 350 angstroms. Accordingly, the inclusion of aluminum improves the antireflection quality of the cap layer.

Referring again to FIG. 5, reflectance of a cap layer is shown. In an exemplary embodiment, the cap layer 56 is approximately 175 angstroms thick and has a composition of $Ti_{1-x}$—$Al_x$—N (where x=0.54). The thickness and concentrations, however, may vary in other embodiments. At a photon source wavelength of 300 to 400 nm, the cap layer exemplary embodiment exhibits a reflectance of not more than 0.10 times reflectance of a bare silicon wafer. For light of an emission wavelength between 350 and 380 nanometers, the cap layer 56 exhibits a reflectance of not more than 0.05 times reflectance of a bare silicon wafer. For light of an emission wavelength between 360 and 370 nanometers, the cap layer 56 exhibits a reflectance of not more than 0.03 times reflectance of a bare silicon wafer. For light of an emission wavelength of approximately 365 nanometers, the cap layer 56 exhibits a reflectance of not more than 0.01 times reflectance of a bare silicon wafer. Such performance was achieved for a cap layer 56 formed by sputtering aluminum and titanium in an atmosphere of nitrogen. The sputtering deposition power for the aluminum is from 1 to 4 times that of the sputtering deposition power of the titanium. The sputtering deposition power of the titanium is 1 kilowatt to 20 kilowatts. Preferably, the cap layer 56 is at least 50 angstroms thick and is composed of 10% to 90% aluminum (by atomic weight). Varying the thickness or composition of the cap layer 56 varies the light wavelength where minimum reflectance occurs. By varying the cap layer thickness, reflectance values of less than 0.10 times reflectance of a bare silicon wafer are achievable for photon source wavelengths between 150 and 400 nm at a cap layer 56 having 10% to 90% aluminum content (by atomic weight). Increasing the cap layer thickness achieves a reflectance minimum of less than 0.10 times reflectance of a bare silicon wafer for light at a wavelength as low as 150 nm. In one embodiment, decreasing the thickness to approximately 150 angstroms achieves a reflectance minimum of less than 0.10 times reflectance of a bare silicon wafer for light as high as approximately 400 nm. For differing sputtering tools or sputtering conditions, the thickness at which such minimum reflectance is achieved varies.

Flat Panel Display Embodiment

Flat panel displays are lighter and utilize less power than conventional cathode ray tube displays. A cold cathode field emission display (FED) uses electron emissions to illuminate a cathodoluminescent screen and generate a visual image. An individual field emission cell typically includes one or more emitter sites formed on a baseplate. The baseplate typically contains the active semiconductor devices that control electron emission from the emitter sites. The emitter sites may be formed directly on a baseplate formed of a material such as silicon or on an interlevel conductive layer (e.g., polysilicon) or interlevel insulating layer (e.g., silicon dioxide, silicon nitride) formed on the baseplate. A gate electrode structure, or grid, is typically associated with the emitter sites. The emitter sites and grid are connected to an electrical source for establishing a voltage differential to cause a Fowler-Nordheim electron emission from the emitter sites. These electrons strike a display screen having a phosphor coating. This releases the photons that illuminate the screen. A single pixel of the display screen is typically illuminated by one or several emitter sites.

In a gated FED, the grid is separated from the base by an insulating layer. This insulating layer provides support for the grid and prevents the breakdown of the voltage differential between the grid and the baseplate. Individual field emission cells are sometimes referred to as vacuum microelectronic triodes. The triode elements include the cathode (field emitter site), the anode (cathodoluminescent element) and the gate (grid).

Figure 8:
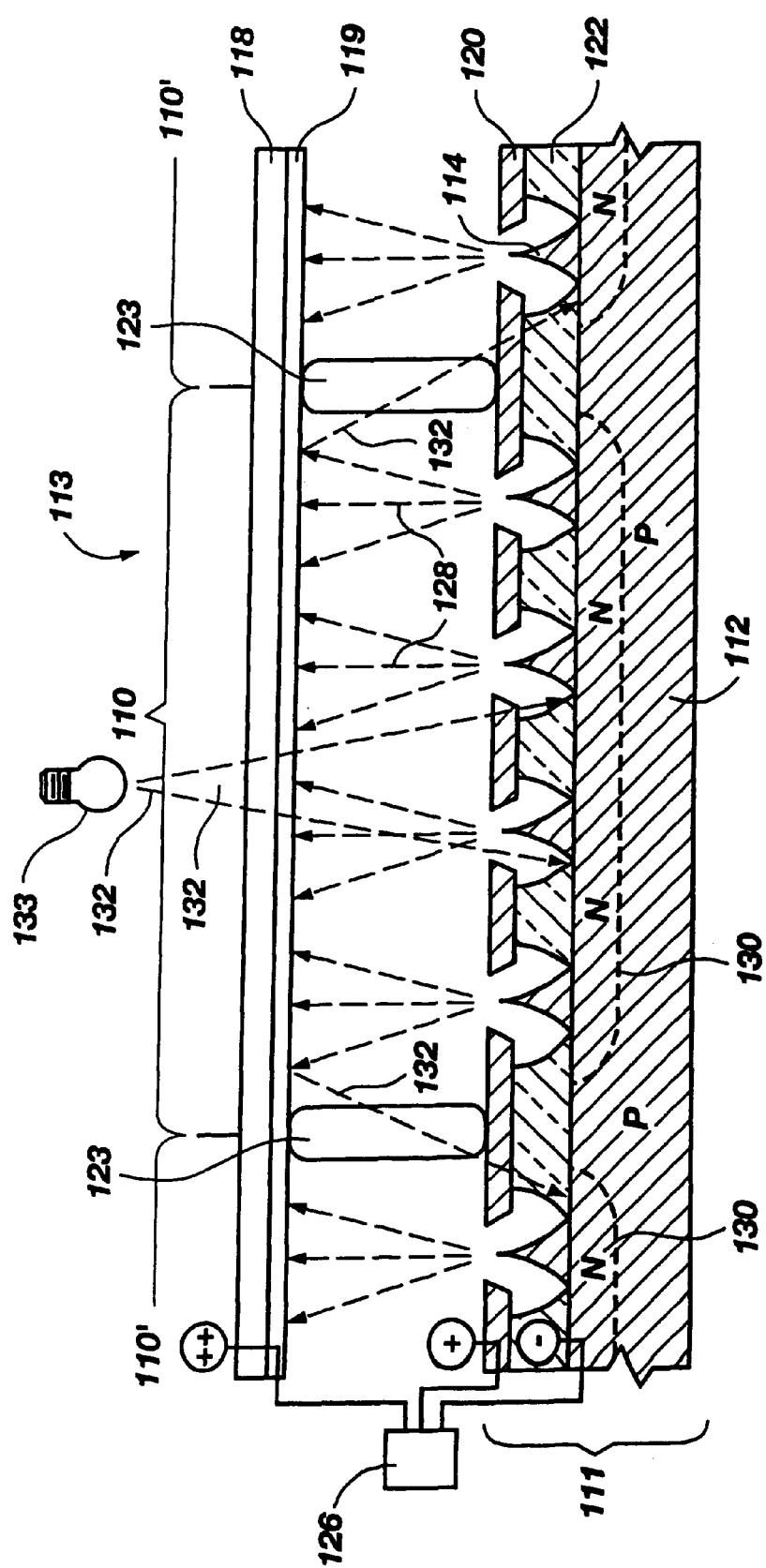
FIG. 8 is a diagram of part of a conventional field emission display device.

FIG. 8 illustrates a pixel site 110 of a field emission display (FED) 113 and portions of adjacent pixel sites 110' on either side. The FED 113 includes a baseplate 111 having a substrate 112 formed of a material such as single crystal P-type silicon. A plurality of emitter sites 114 is formed on an N-type conductivity region 130 of the substrate 112. The P-type substrate 112 and N-type conductivity region 130 form a P/N junction. This type of junction can be combined with other circuit elements to form electrical devices, such as FETs, for activating and regulating current flow to the pixel sites 110 and 110'.

The emitter sites 114 are adapted to emit electrons 128 that are directed at a cathodoluminescent display screen 118 coated with a phosphor material coating 119. A gate electrode or grid 120, separated from the substrate 112 by an insulating layer 122, surrounds each emitter site 114. Support structures 123, also referred to as spacers, are located between the baseplate 111 and the display screen 118.

An electrical source 126 establishes a voltage differential between the emitter sites 114 and the grid 120 and cathodoluminescent display screen 118. The electrons 128 from activated emitter sites 114 generate the emission of photons from the phosphor material contained in a corresponding pixel site 110 of the cathodoluminescent display screen 118. To form a particular image, it may be necessary to illuminate pixel site 110 while adjacent pixel sites 110' on either side remain dark. Problems occur due to photons 132 reflected off the cathodoluminescent display screen 118 phosphor material coating 119 and to photons 132 generated by sunlight or other environmental light sources 133. As described above, the photons 132 may adversely impact circuit junctions.

FIG. 9 shows a portion of an FED 150. Like components of the FED in FIG. 8 are assigned like numbers in FIG. 9. A pair of emitter sites 114 is formed with one or more sharpened tips as shown, or with one or more sharpened cones, apexes or knife edges. The emitter sites 114 are formed on a substrate 112. In the illustrative embodiment, the substrate 112 is single crystal P-type silicon. Alternately, the emitter sites 114 may be formed on another substrate material or on an intermediate layer formed of a glass layer or an insulator-glass composite. In the illustrative embodiment, the emitter sites 114 are formed on an N-type conductivity region 158. The N-type conductivity region 158 is part of a source or drain of an FET transistor 140 that controls the emitter sites 114. The N-type conductivity region 158 and P-type substrate 112 form a semiconductor P/N junction.

Surrounding the emitter sites 114 is a gate structure or grid 120. The grid 120 is separated from the substrate 112 by an insulating layer 122. The insulating layer 122 includes etched openings 124 for the emitter sites 114. The grid 120 is connected to conductive lines 116 formed on an interlevel insulating layer 125. The conductive lines 116 are embedded in the insulating and/or passivation layer 125 and are used to control operation of the grid 120 or other circuit components.

The cathodoluminescent display screen 118 is aligned with the emitter sites 114 and includes a phosphor material coating 119 in the path of electrons 133 emitted by the emitter sites 114. The emitter sites 114 are driven by a display FET transistor 127. The transistor 140 source is connected directly or indirectly to one or more emitter sites 114. The display transistors are coupled to a control source voltage, $V_R$, to define a structure that functions as the FED device's cathode. An electrical source is also connected to the grid 120 to define a voltage $V_G$. Yet another voltage signal, $V_A$, is coupled to the cathodoluminescent display screen 118 to define the device anode.

When a voltage differential is generated between emitter sites 114, grid 120 and the cathodoluminescent display screen 118, electrons 133 are emitted at the emitter sites 114. These electrons 133 strike the phosphor material coating 119 on the display screen 118. This produces the photons 132 that illuminate the cathodoluminescent display screen 118.

Transistors 127 and 140 are shown in FIGS. 9 and 10. FIG. 10 is an electrical schematic of the semiconductor structures shown in FIG. 9. The FET transistor 140 serves to limit the current generated by the display transistor 127. For all of the circuit elements described thus far, fabrication processes that are known in the art can be utilized. As an example, U.S. Pat. No. 5,186,670, to Doan et al., describes suitable processes for forming the substrate 112, emitter sites 114 and grid 120. The substrate 112 and grid 120 and their associated circuitry form the baseplate of the FED. The silicon substrate 112 contains semiconductor devices that control the operation of the emitter sites 114. These devices are combined to form row-column drive circuitry, current regulation circuitry, and circuitry for electrically activating or isolating the emitter sites 114. As an example, the previously cited U.S. Pat. No. 5,210,472, to Casper et al., describes pairs of MOSFETs formed on a silicon substrate and connected in series to emitter sites. One of the series connected MOSFETs is gated by a signal on the row line. The other MOSFET is gated by a signal on the column line.

In accordance with the present invention, an antireflective Ti—Al—N layer 200 is formed over at least a portion of the drive transistor 127, 140 structures. Specifically, the antireflective Ti—Al—N layer 200 is formed over the drain and control gate junctions of display FET transistor 127 and over all the junctions of current limiting transistor 140. The Ti—Al—N layer 200 prevents light from the environment and light generated at the cathodoluminscent display screen 118 from striking semiconductor junctions, such as the junctions formed between the N-type conductivity regions 170, 172, 174 and the substrate 112. A passivation layer 202 is formed over Ti—Al—N layer 200. A deposition technique such as CVD, sputtering or electron beam deposition (EBD) is used to form the Ti—Al—N layer 200.

Meritorious and Advantageous Effects

With regard to the wiring line embodiments, one advantage of the Ti—Al—N antireflective cap layer is to reduce reflectance by a factor of approximately 10 (relative to a conventional metal stack cap layer formed by titanium nitride at a typical photolithographic wavelength of 365 nanometers). As a result, notching is substantially reduced. Also, electromigration resistance and stress migration resistance are substantially improved. According to another advantage, the use of titanium-aluminum as an underlayer reduces stress at the aluminum layer, thereby improving electromigration resistance and stress migration resistance. Also, the use of a titanium-aluminum underlayer avoids the need for a separate sputter chamber when forming the Ti—Al—N cap layer.

With regard to the FED device embodiments, one advantage of the Ti—Al—N layer is to shield the semiconductor junctions from exposure to photons that adversely impact the junction electrical characteristics. As a result, inadvertent driving of undesired pixels associated with such photon exposure is avoided. The blurring and image degradation accompanying such inadvertent driving also are avoided.

Although preferred embodiments of the invention have been illustrated and described, various alternatives, modifications and equivalents may be used. Therefore, the foregoing description should not be taken as limiting the scope of the inventions which are defined by the appended claims.

What is claimed is:

1. A method of forming a wiring line for a semiconductor substrate, comprising the steps of:
    applying a first layer over a surface of a semiconductor substrate;
    applying a second, conductive layer comprising aluminum over an outer surface of the first layer; and
    applying a third layer comprising titanium, aluminum and nitrogen over an outer surface of the second layer.

2. The method of claim 1, further comprising the step of:
    exposing the third layer to a photon source and using the third layer as an antireflective layer to absorb photons.

3. The method of claim 2, further comprising emitting photons from the photon source within an emission wavelength included within the range of 150 and 400 nanometers and constituting the third layer to exhibit a reflectance of not more than 0.10 times reflectance of a bare silicon wafer when exposed to photons of said emission wavelength.

4. The method of claim 2, further comprising emitting photons from the photon source within an emission wavelength in the range of 350 and 380 nanometers, and forming the third layer to a thickness and composition to exhibit a reflectance of not more than 0.05 times reflectance of a bare silicon wafer when exposed to said emission wavelength.

5. The method of claim 2, further comprising emitting photons from the photon source within an emission wavelength in the range of 360 and 370 nanometers, and forming the third layer to a thickness and composition to exhibit a reflectance of not more than 0.05 times reflectance of a bare silicon wafer when exposed to said emission wavelength.

6. The method of claim 2 further comprising emitting photons from the photon source at an emission wavelength of approximately 365 nanometers and constituting the third layer to exhibit a reflectance of not more than 0.01 times reflectance of a bare silicon wafer when exposed to said emission wavelength.

7. The method of claim 1, further comprising applying the first layer to consist of titanium and aluminum and employing the aluminum in the first layer to reduce a volume of aluminum in the second, conductive layer reacting with the titanium in the first layer during the heating of wiring line.

8. The method of claim 7 further comprising forming the second conductive layer to a thickness of at least 2000 angstroms and forming the first layer to comprise 20% to 80% aluminum.

9. The method of claim 8, wherein heating the semiconductor substrate to a temperature of at least 350° C. and limiting a decrease in thickness of the wiring line responsive to the heating to less than 100 angstroms.

10. A method of forming a wiring line for a semiconductor substrate, comprising the steps of:

applying a first layer consisting of aluminum and titanium over a surface of a semiconductor substrate; and applying a second layer comprising aluminum over an outer surface of the first layer.

11. The method of claim 10, further comprising forming said first layer to be between 20% and 80% aluminum by weight.

12. The method of claim 10, further comprising constituting said first layer to reduce shrinkage of said second layer during a heat treatment process.

13. The method of claim 10, further comprising applying a third layer comprising titanium, aluminum and nitrogen over an outer surface of said second layer.

14. The method of claim 13, further comprising constituting said third layer to exhibit a photon reflectance of not more that 0.05 times reflectance of a bare silicon wafer when exposed to a photon source having an emission wavelength between 325 and 400 nanometers.

15. The method of claim 14, further comprising forming said third layer to a thickness of between about 50 angstroms and 500 angstroms.

16. The method of claim 13, further comprising constituting said third layer to exhibit a photon reflectance of not more that 0.10 times reflectance of a bare silicon wafer when exposed to a photon source having an emission wavelength between 150 and 400 nanometers.

17. The method of claim 13, further comprising constituting said third layer to exhibit a photon reflectance of not more that 0.03 times reflectance of a bare silicon wafer when exposed to a photon source having an emission wavelength between 360 and 370 nanometers.

18. The method of claim 17, further comprising forming said third layer to a thickness of approximately 175 angstroms.

19. The method of claim 13, further comprising constituting said third layer to exhibit a photon reflectance of not more that 0.01 times reflectance of a bare silicon wafer when exposed to a photon source having an a wavelength of approximately 365 nanometers.

20. The method of claim 19, further comprising forming said third layer to a thickness of approximately 175 angstroms.

* * * * *

UNITED STATES PATENT AND TRADEMARK OFFICE
CERTIFICATE OF CORRECTION

| | | |
|---|---|---|
| PATENT NO. | : 6,194,308 B1 | Page 1 of 1 |
| APPLICATION NO. | : 09/421165 | |
| DATED | : February 27, 2001 | |
| INVENTOR(S) | : Everett A. McTeer, Russell C. Zahorik and Scott G. Meikle | |

It is certified that error appears in the above-identified patent and that said Letters Patent is hereby corrected as shown below:

On the title page:
    In Item (54),      Title,      change "WIRE" to --WIRING--

In the specification:
    COLUMN 1,      LINE 1,      change "WIRE" to --WIRING--
    COLUMN 9,      LINE 29,      before "display" insert --cathodoluminescent--

In the claims:
CLAIM 19, COLUMN 12,      LINE 20,      change "a wavelength" to --emission wavelength--

Signed and Sealed this

Twenty-second Day of January, 2008

JON W. DUDAS
*Director of the United States Patent and Trademark Office*

UNITED STATES PATENT AND TRADEMARK OFFICE
CERTIFICATE OF CORRECTION

PATENT NO.        : 6,194,308 B1
APPLICATION NO.   : 09/421165
DATED             : February 27, 2001
INVENTOR(S)       : Everett A. McTeer, Russell C. Zahorik and Scott G. Meikle It is certified that error appears in the above-identified patent and that said Letters Patent is hereby corrected as shown below:

On the title page:
    In Item (54), Title, change "WIRE" to --WIRING--

In the specification:

| | | |
|---|---|---|
| COLUMN 1, | LINE 1, | change "WIRE" to --WIRING-- |
| COLUMN 1, | LINE 67, | delete "said" |
| COLUMN 3, | LINE 22, | change "The" to --the-- |
| COLUMN 4, | LINE 55, | after "underlayer" delete "layer" |
| COLUMN 5, | LINE 38, | change "IC 18" to --IC 18'-- |
| COLUMN 5, | LINE 44, | after "underlayer" delete "layer" |
| COLUMN 8, | LINE 40, | before "display" insert --cathodoluminescent-- |
| COLUMN 8, | LINE 67, | change "transistor 140" to --transistor 127-- |
| COLUMN 9, | LINE 17, | after "The" insert --FET-- and change "140" to --127-- |
| COLUMN 9, | LINE 29, | before "display" insert --cathodoluminescent-- |
| COLUMN 9, | LINE 56, | after "limiting" insert --FET-- |

In the claims:

| | | | |
|---|---|---|---|
| CLAIM 7, | COLUMN 10, | LINE 65, | after "during" delete "the" and before "wiring" insert --the-- |
| CLAIM 9, | COLUMN 11, | LINE 3, | change "wherein" to --further comprising-- |
| CLAIM 14, | COLUMN 11, | LINE 24, | change "that" to --than-- |
| CLAIM 16, | COLUMN 12, | LINE 6, | change "that" to --than-- |
| CLAIM 17, | COLUMN 12, | LINE 11, | change "that" to --than-- |
| CLAIM 19, | COLUMN 12, | LINE 19, | change "that" to --than-- |

UNITED STATES PATENT AND TRADEMARK OFFICE
CERTIFICATE OF CORRECTION

PATENT NO. : 6,194,308 B1
APPLICATION NO. : 09/421165
DATED : February 27, 2001
INVENTOR(S) : Everett A. McTeer, Russell C. Zahorik and Scott G. Meikle It is certified that error appears in the above-identified patent and that said Letters Patent is hereby corrected as shown below:

In the claims (continued):
CLAIM 19,    COLUMN 12,    LINE 20,    change "a wavelength" to --emission wavelength--

Signed and Sealed this

Fourth Day of March, 2008

JON W. DUDAS
*Director of the United States Patent and Trademark Office*